United States Patent [19]

Wu

[11] 4,439,245
[45] Mar. 27, 1984

[54] ELECTROMAGNETIC RADIATION ANNEALING OF SEMICONDUCTOR MATERIAL

[75] Inventor: Chung P. Wu, Mercerville, N.J.

[73] Assignee: RCA Corporation, New York, N.Y.

[21] Appl. No.: 342,473

[22] Filed: Jan. 25, 1982

[51] Int. Cl.³ .................... H01L 21/263; B23K 27/00
[52] U.S. Cl. .................... 148/1.5; 29/576 B; 148/187; 219/121 L; 357/91; 427/53.1
[58] Field of Search ............ 148/1.5, 187; 357/91; 219/121 L; 427/53.1; 29/576 B

[56] References Cited

U.S. PATENT DOCUMENTS

| | | | |
|---|---|---|---|
| 4,059,461 | 11/1977 | Fan ........................................ | 148/1.5 |
| 4,187,126 | 2/1980 | Radd et al. ........................... | 148/1.5 |
| 4,234,356 | 11/1980 | Auston et al. ....................... | 148/1.5 |
| 4,309,225 | 1/1982 | Fan et al. ............................. | 148/1.5 |
| 4,315,130 | 2/1982 | Inagaki et al. ................... | 219/121 L |

OTHER PUBLICATIONS

"Epitaxial Laser Crystallization of Thin-film Amorphous Silicon" by J. C. Bean et al., *Appl. Phys. Lett.*, 33(3) Aug. 1978, pp. 227-230.

A Nomarski Micrograph, an Enlarged Copy of FIG. 2 Shown on p. 228 of the Bean et al., Article Citation AR, Supra.

"Time-Resolved Raman Scattering and Transmission Measurements During Pulsed Laser Annealing" by A. Compaan et al., *Laser and Electron-Beam Solid Interactions and Material Processing*, pp. 15-22, Publ. by Elsevier North Holland Inc., 1981.

"Reasons to Believe Pulsed Laser Annealing of Si Does Not Involve Simple Thermal Melting" by J. A. Van Vechten et al., *Phys. Lett.*, Dec. 10, 1979, vol. 74A, No. 6, pp. 417-421.

"Nonthermal Pulsed Laser Annealing of Si; Plasma Annealing" by J. A. Van Vechten et al., *Phys. Lett.*, Dec. 10, 1979, vol. 74A, No. 6, pp. 422-426.

"Laser Cold Processing Takes the Heat Off Semiconductors" by R. A. Kaplan et al., *Electronics*, Feb. 28, 1980, pp. 137-142.

A Manual by Molectron Corp. on ND:YAG Lasers, Printed in USA, May 1979, pp. 1-16.

Boston Meeting Symp. Rept., *Laser Focus*, Jan. 1982, pp. 12, 14, 16 and 18.

Gibson, J. Vac. Sci. Technol, 18 (1981) 810.

Leamy et al., Appl. Phys. Letts. 32 (1978) 535.

Lo et al., Phys. Rev. Letts. 44 (1980) 1604.

*Primary Examiner*—Upendra Roy
*Attorney, Agent, or Firm*—Birgit E. Morris; Donald S. Cohen; Joseph D. Lazar

[57] ABSTRACT

A beam of electromagnetic radiation such as a pulsed laser beam is used to anneal materials, such as semiconductor materials, without the formation of puddles. Puddles are caused by raising the temperature of the material to its melting temperature by a laser beam. The beam of the pulsed laser can be scanned over the surface of the semiconductor material without raising the temperature to the melting temperature and with at least about 50% overlap of each irradiated surface portion whereby extensive surface areas can be annealed rapidly without puddling.

7 Claims, 6 Drawing Figures

ELECTROMAGNETIC RADIATION ANNEALING OF SEMICONDUCTOR MATERIAL

This invention relates to annealing material by a beam of electromagnetic radiation more particularly by a pulsed laser beam.

BACKGROUND OF THE INVENTION

The use of high power laser beams to anneal implant damage in semiconductor materials or to achieve crystallization of amorphous thin films has been investigated intensively in the past several years. Some of the advantages of laser annealing over conventional furnace annealing are: fast and room temperature processing without the need of furnaces; laser annealing is inherently localized and a very rapid heating process so that deleterious effects that go with heating the entire semiconductor wafer, for example in a furnace, do not occur; semiconductor wafers do not need capping layers with laser annealing processing and, moreover, often less photolithographic process steps are needed. In addition, significant advantages occur from laser annealing in that one can achieve higher dopant activation than allowed by the solid solubility. Moreover, the dopant profile can be controlled with a higher degree of accuracy. For example, an ion implanted layer can be annealed with little or no impurity redistribution. Accordingly, precise control of the impurity profile in fabricating fine device structures is achievable. Still another advantage of laser annealing is that it can achieve graphoepitaxy which is the crystallization of amorphous or polycrystalline films on texturized amorphous substrates such as silicon oxide ($SiO_2$) or silicon nitride ($Si_3N_4$).

There are, in general, three types of known lasers being used in the laser annealing art. They are:
1. Q-switched neodymium:glass (Nd:glass) or ruby laser;
2. Q-switched neodymium:yttrium aluminum garnet (Nd:YAG) laser; and
3. Continuous Wave (CW) lasers.

The Nd:glass laser usually has a pulse width of 10-50 nanoseconds (ns). This type of laser has a relatively large beam spot diameter in the order of 1-2 centimeters (cm) and thus can be used to irradiate a 2 inch (5 cm) wafer with a single pulse. However, such a laser develops hot spots and cannot reproduce the pulse energy reliably.

The Nd:YAG laser has a pulse width in the order of 75-300 ns with a repetition rate of 5 to 10 KHz. This sort of laser is more stable and provides better reproducible beam energies than the Nd:glass laser. However, the small beam spot size of such lasers in the order of 40 $\mu$m in diameter discourages its use for annealing semiconductor materials, such as wafers, since the amount of time necessary to achieve a total surface exposure of the beam is long. Moreover, such lasers develop "puddles" of the semiconductor material due to the melting of the material on the surface by the laser beam during the laser annealing process. "Puddles" or "puddle topography" are illustrated in FIGS. 2 and 3 to be later described.

The CW lasers are usually used with a 1-10 millisecond (ms) beam dwell time. The advantage of such lasers is that there is no redistribution of ion-implanted impurities after CW laser annealing. However, the use of CW lasers are too slow for practical manufacturing processes and moreover the CW laser beam induces stress in the annealed surfaces.

There is much in the literature discussing laser annealing, and, more particularly, with respect to the present invention, the process known as "pulsed plasma annealing" (PPA) which should be distinguished from "pulse laser annealing". See the following publications for detailed discussions on various aspects of PPA: "Epitaxial laser crystallization of thin-film amorphous silicon" by J. C. Bean et al., Appl. Phys. Lett., 33(3), August 1978, pp. 227–230; "Time-Resolved Raman Scattering and Transmission Measurements During Pulsed Laser Annealing" by A. Compaan et al. in *Laser and Electron-Beam Solid Interactions and Material Processing*, pp. 15–22, published by Elsevier North Holland, Inc., 1981; "Reasons To Believe Pulsed Laser Annealing of Si Does Not Involve Simple Thermal Melting" by J. A. Van Vechten et al., Phys. Lett., Dec. 10, 1979, Vol. 74A, No. 6, pp. 417–421; and "Nonthermal Pulsed Laser Annealing of Si; Plasma Annealing" by J. A. Van Vechten et al., Phys. Lett., Dec. 10, 1979, Vol 74A, No. 6, pp. 422–426. Special note is made of the two articles by Van Vechten et al. discussing non-thermal annealing. According to their hypotheses silicon is annealed under certain conditions, by PPA without melting.

See an article by R. A. Kaplan, et al. entitled "Laser Cold Processing takes the heat off Semiconductors," in *Electronics*, Feb. 28, 1980, pp. 137–142 for a summary of laser systems (Table 3, p. 139) used in the prior art.

None of the above laser systems are capable of annealing wafers having diameters in the order of 3-4 inches (7.5-10 cm) with reasonable uniformity, reproducibility and wafer throughput. To date, experimental use of these equipments for laser annealing has been done to the best of my knowledge only with small batch samples. There appears to be no manufacturing facility or production line that provides for laser annealing in a process schedule even though the advantages of laser annealing, as outlined above, are attractive.

SUMMARY OF THE INVENTION

The surface layer of a body of semiconductor material having covalent bonds is irradiated with a pulsed beam of electromagnetic radiation having a wavelength and power density sufficient to crystallize the surface layer material by annealing without raising the temperature of the material to its melting temperature. The diameter of the beam is preferably significantly greater than the depth of the material to be annealed. The surface can be scanned with the beam to irradiate a large surface area, such as a wafer of semiconductor material, to anneal without causing puddling topography.

The scanning feature of the invention is particularly useful in production lines which require uniformity and reproducibility in annealing a large surface such as an entire wafer with reasonable throughput.

DETAILED DESCRIPTION OF A PREFERRED EMBODIMENT

Figure 1:
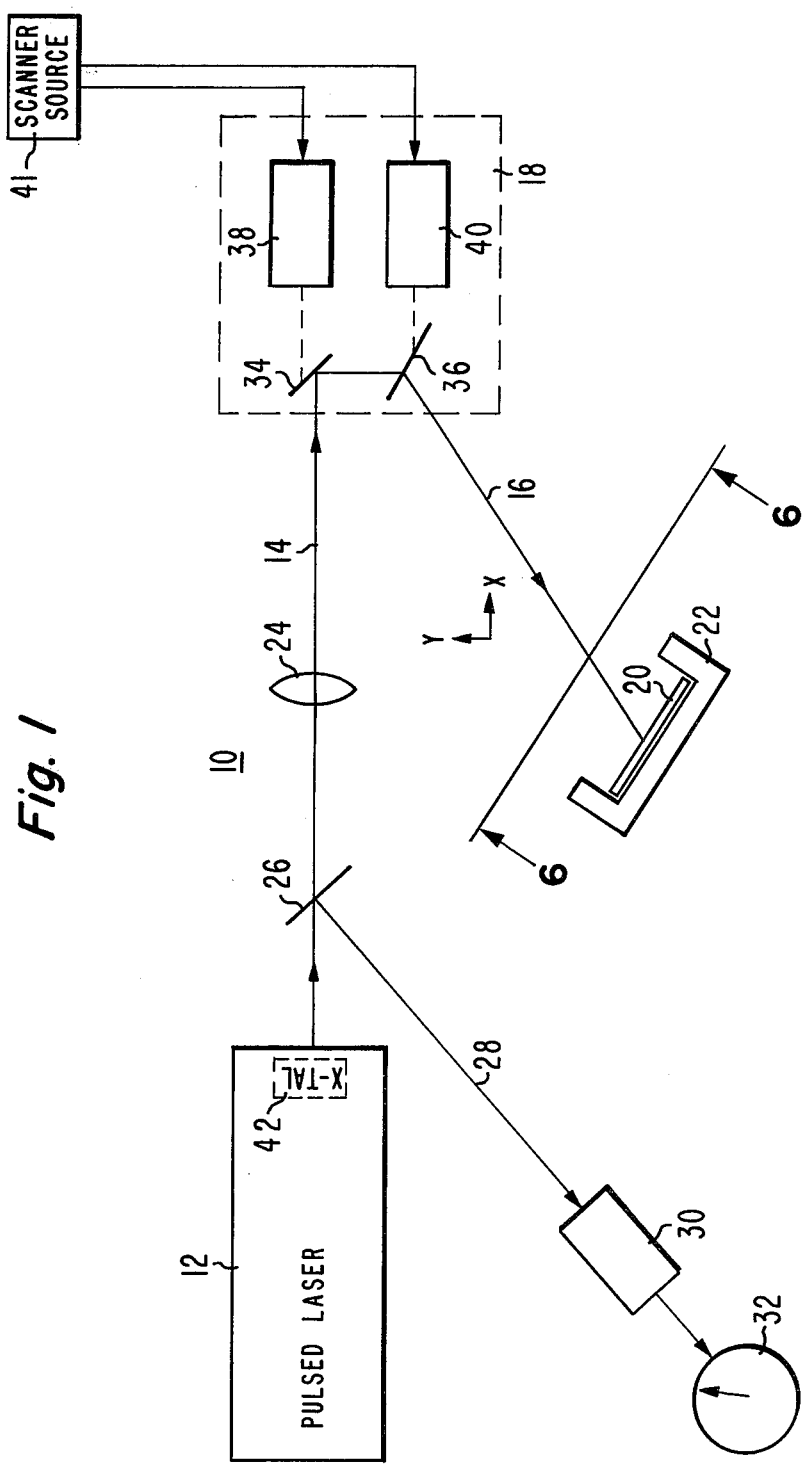
FIG. 1 is a schematic of a pulsed laser system for practicing the invention.

A schematic of a pulsed laser annealing system embodying the present invention is illustrated in FIG. 1. A source of electromagnetic energy radiation, such as a pulsed laser 12, provides a beam 14 that is optically scanned by a scanner 18 providing a scanned beam 16 impinging on the surface of a body of material, such as a silicon wafer 20, supported in a wafer holder 22. The laser beam 14 is focused by a lens 24.

The beam 14 from the laser 12, conveniently termed the primary beam 14, is sampled for control purposes by a beam splitter 26. Splitter 26 provides a sampled beam 28 of about 5% of the total beam energy which sampled beam 28 is coupled to a thermopile laser power meter head 30 which in turn provides a signal coupled to a calibrated meter 32 for indicating the power of the laser beam 14.

The optical scanner 18 is suitably formed of a pair of mirrors 34 and 36 that are mounted to be driven by a galvanometer 38 and a galvanometer 40, respectively. The mirrors 34 and 36 are dielectric-coated for near-100% reflection and are arranged along the output optics of the pulsed laser 12 so as to effect x and y scanning deflections of the beam 14 to the surface of the wafer 20 as the reflected beam 16. The beam 16 is thus deflected in an x and y raster scan similar to a TV-raster. Accordingly, the galvanometers 38 and 40 are driven by a suitable saw tooth signal from a source 41 to effect the desired scanning. The oscillatory motion of the mirrors can be accurately controlled with different voltage waveforms such as a saw tooth or ramp signal with adjustable periodicity and amplitude in a manner as well known in the art. Accordingly, adjustment on the amount of overlapping that occurs between adjacent pulse spots from the beam 16 onto the target wafer 20 can be provided as desired. The target wafer 20 is located about two meters from the optical scanner mirrors 34 and 36 to minimize variations in the angle of incidence at different locations on the wafer, which is typically of about 3" (7.5 cm.) in diameter.

Uniformity of annealing is achieved by scanning the laser beam 16 over the surface of the wafer with at least a 50% overlap between adjacent pulses. The laser pulsed energy is desirably quite stable whereby annealing can be achieved with reasonable reproducibility. Moreover, the wafer throughput, for example, of 3" (7.5 cm) diameter wafers, is also predictably quite high, for example in the order of 20 to 60 wafers/hour. Accordingly, the embodiment of the invention being described is capable of handling production quantity wafers.

The laser 12 provides a pulsed beam of electromagnetic optical radiation having sufficient energy to cause the material of the wafer 20 to be annealed by activity of electrons derived principally from the energy conversion of the radiation photons and, moreover, with much less contribution from any atomic motion activity inherent in the material. This photon-derived electron activity effects the annealing process which converts the material into crystalline form by breaking the covalent bonds of the constituents of the material and allowing them to reform into a lattice of essentially single crystalline form. The photon-derived electrons are components of a plasma comprising electron-hole pairs generated by the photo-energy conversion process. This annealing plasma is known in the art as pulsed plasma annealing (PPA) as mentioned hereinabove. According to the theory of PPA, annealing is accomplished by the pulsed generation of a very high density plasma within the material, resulting in the breakage of almost all the covalent bonds so that the properties of the material resembles those of a liquid but with the physical temperature of the material during this exposure to the pulsed beam far below the normal melting point of the material. This mechanism, it should be understood, is in contrast to the annealing process developed by purely thermal mechanisms, i.e. mechanisms of the motion of the atomic particles of the material. The wavelength of the laser beam as well as the pulse width of the beam determine whether thermal annealing or pulse plasma annealing will be the dominant mechanism. The problem that has been prevailing in the prior art of undesirable melting of the material during annealing causing the puddle effect has been due to thermal annealing phenomenon.

Figure 2:
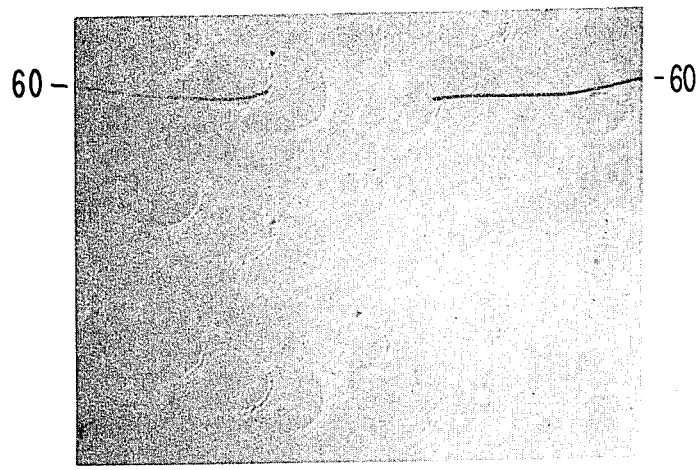
FIGS. 2 and 3 are micrographs of surface portions of silicon wafers that have been annealed using a prior art laser system whereby puddles are formed.
Figure 3:
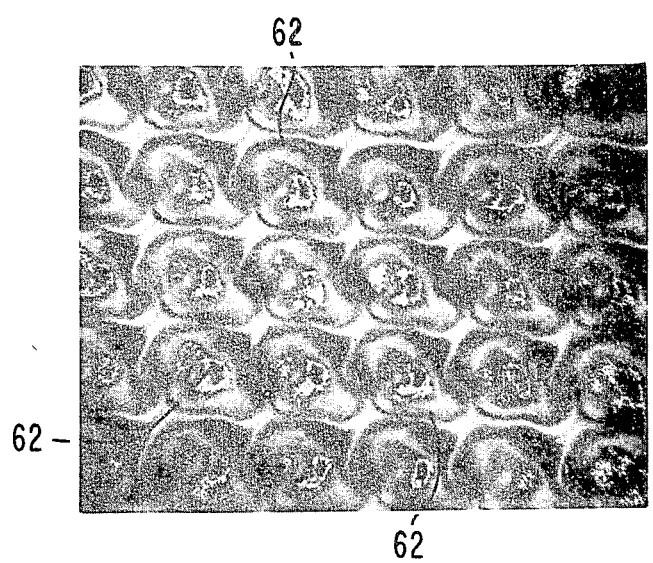

According to the present invention, the problem of this melting effect causing, that which is sometimes termed, puddle topography, is overcome by certain conditions that must be met. Micrographs of puddle topography are shown in FIGS. 2 and 3 to be described hereinafter. The conditions to overcome the puddle topography in annealing silicon, for example, comprise: first, the wavelength of the laser for silicon material must be equal to or less than 0.6 micrometer. This value of 0.6 micrometer has been determined by me both empirically and experimentally in relation to the absorption characteristics of silicon. The wavelength must be sufficiently small so that the energy absorption is confined to the surface layer consisting of covalent bonded material. If the wavelength is greater than 0.6 μm, the absorption depth would be too deep to develop a dense plasma.

The relationship of the photon energy in ($E_{ph}$) in electron volts (eV) of a laser beam with a wavelength λ is given by:

$$E_{ph} = hc/\lambda \tag{1}$$

where h is Planck's constant and c is the velocity of light.

Moreover, the requirement for adequate absorption of the photon energy, ($E_{ph}$) near the surface of the semiconductor material with band gap energy ($E_g$) measured in electron volts (eV) is:

$$E_{ph} \sim 2E_g \tag{2}$$

Thus the photon energy should be at least twice the value of the band gap energy in order for the photons to be adequately absorbed near the surface of the material. If the photon energy is less than the band gap energy, there would be no absorption of the photon energy and the material would thus be transparent to the beam.

In addition, since the parameters "hc" of equation (1) equals 1.237, equations (1) and (2) can be modified as follows:

$$\lambda \lesssim 1.237/2E_g \tag{3}$$

The wavelength of the laser beam is thus related to the absorption of the photon energy by the material as a function of the band gap energy and is thus used as a criterion to determine the thickness of the surface layer that is to be annealed.

Second, the pulse width of the laser beam 16 must be equal to or less than 50 nanoseconds. The pulse width determines the amount of time that the laser beam is impinging on the surface of the material and thus affects the amount of energy per unit time that is imparted to the material. If the time period is too long, the thermal effect, again, will be stimulated to cause the undesirable melting. Thus, the pulse width of each pulse of radiation energy must be of such short duration as to reduce, if not minimize, the diffusion depth of electrons and holes in the material so that a high enough plasma density can be achieved in the surface layer of the material.

Third, the diameter of the beam must be significantly greater that the desired depth of the material to be annealed to obviate convection flow of the material during the annealing process. It should be understood that the convective flow occurs in the prior art annealing processes whereby the puddle topology is caused by the thermal annealing processes discussed above. In the embodiment being described, the beam diameter was determined to be on the order of 5.0 mm.

The above recited conditions, which are identified for convenience as conditions C1, C2 and C3, respectively, are essential to avoid puddling during the annealing process. In addition to the conditions C1-C3, it is clear that the laser beam power requirements must be sufficient to provide the desired energy into the material to crystallize the material by breaking the covalent bonds and to do so without undue melting. I have found that the power requirements to achieve good annealing for silicon is in the range of 0.5 to 0.8 joules/cm$^2$ for a laser with a pulse width of 10-15 ns.

The scanning rate of the system will be based on the desired throughput, that is, the number of wafers that are to be processed per hour as well as the amount of overlap that is to be provided to achieve uniform exposure.

Uniform exposure is achieved according to the criterion of at least 50% overlap of each pulse relative to the previous pulse. The amount of overlap is determined by the exposed area of the surface material actually exposed to the beam. This will be explained in further detail with respect to FIGS. 5 and 6. In addition, it should be understood that the annealing effect of each pulse is independent of the effect of every other pulse that has occurred. The reason for this is that the annealing effects of each pulse is short (~100 ns) compared to the separation of the pulses (1.0 sec.). It should be understood further that as the amount of overlap is extended from the minimum of 50% to a maximum of 100% no scanning will be effected since a 100% overlap means, obviously, no movement of the beam. Accordingly, the scanning rate is a function of the maximum possible throughput but with uniform exposure. Once the material has been converted to a crystalline state additional or further annealing will not affect the crystalline state of the material.

In a system according to the above criteria, a pulsed laser system used to anneal a semiconductor wafer formed of silicon and having a diameter of 3" (7.5 cm) would have the following specifications:

The wavelength to provide adequate absorption in silicon would be 0.53 $\mu$m. The power should be about 0.6 joule/cm$^2$ with a pulse width of about 15 nanoseconds for each pulse. Moreover, the scanner should move the beam 16 over a 3" diameter wafer with about a 50% overlap between adjacent pulses in about one to two minutes.

At the present state of the art of commercially available laser systems, selecting a laser to meet the requirements of annealing a semiconductor material according to the invention is difficult. However, a commercially available laser system, that satisfies the requirements adequately, is manufactured by the Molectron Corporation, as its Model MY34. It is a pulsed Nd:YAG laser. This laser achieves the desired high pulse energy output with a near Gaussian beam intensity profile by utilizing what is known as a polarization-coupled "unstable resonator" technique. In brief, an unstable resonator is one in which polarizers of the laser resonator are coupled to inhibit certain modes of resonance. The nominal laser beam diameter of the system is 8 mm with a pulse width of 15-30 nanoseconds and a pulse energy at 1.06 $\mu$m of 700 milli-joules. The output beam is converted to the required 0.53 $\mu$m wavelength needed for adequate absorption in the silicon by passing the primary radiation through a second harmonic generator which consists of a KD*P crystal (a crystal formed of potassium dideuterium phosphate). This crystal with suitable frequency doubling and filtering means as known in the art provides means to double the frequency and thus half the wavelength of the laser beam. Such a means is shown in FIG. 1 as filtering mechanism 42 of the laser 12. The conversion efficiency of mechanism 42 is about 30%. The 1.06 $\mu$m component of the laser beam is either dumped into a so-called "beam dump" of known form or brought out coaxially with the beam component at 0.53 $\mu$m wavelength.

The laser beam 14 is suitably pulsed at 10-20 pulses/second (pps) with a pulsed energy stability of ±2% for the 1.06 $\mu$m component and ±4% for the 0.53 $\mu$m component. An ideal system is one having a 5 inch (12.7 cm) uniform intensity beam with wavelength and power requirements as outlined above. Unfortunately, such a system does not now exist to my knowledge.

Figure 5:
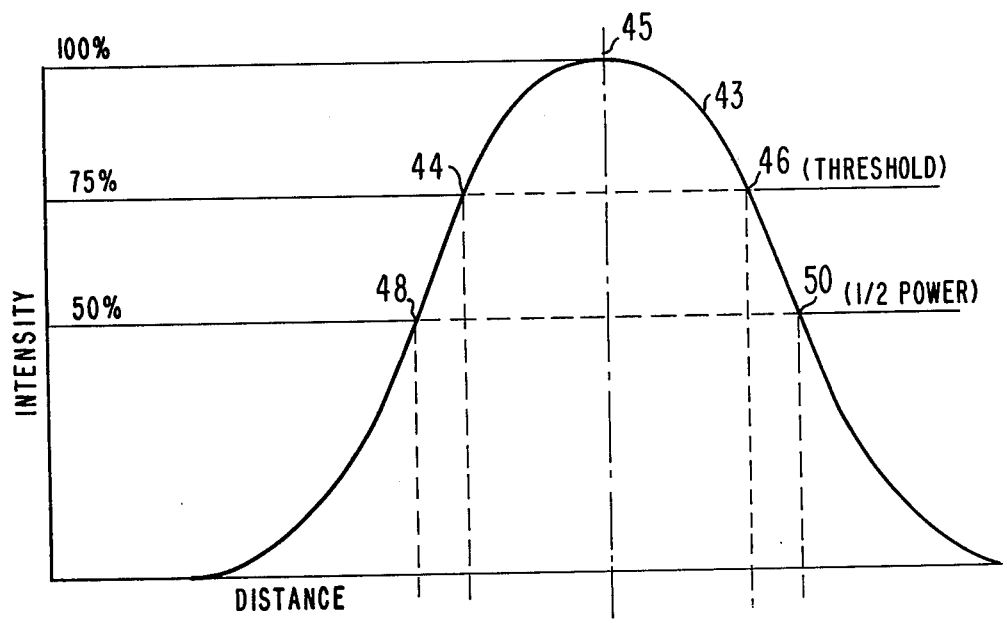
FIG. 5 is a plot of a typical near-Gaussian energy distribution curve for a laser pulse and its annealing effects on the surface of a semiconductor body for a pulse of laser energy.
Figure 6:
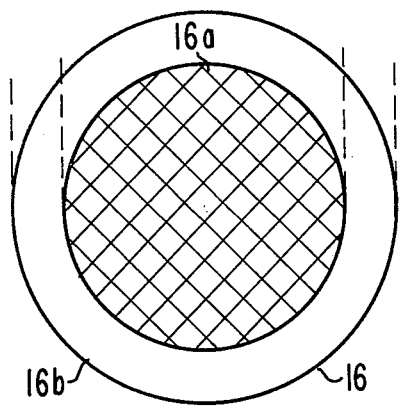
FIG. 6 is a cross-sectional view of pulsed beam as seen along viewing plane 6—6 of the beam 16 as shown in FIG. 1, and related to the curve of FIG. 5.

Reference is now made to FIG. 5 which shows, a typical Gaussian distribution curve 43 as used in the art of the relative intensity of one pulse of the beam 16 irradiating surface of the wafer 20 and to FIG. 6 showing the cross section of the beam 16 taken at viewing line 6—6 in FIG. 1. The beam energy not being uniform throughout is represented by a more intense central region 16a and a less intense region 16b in the peripheral region, as seen in FIG. 6, correlated to the cross-sectional view of the beam 16 in FIG. 5 by the dotted lines. The Gaussian distribution curve 43 is related to beam region 16a by the threshold value at points 44 and 46, respectively, of the curve 43 at about 75% of the maximum value or peak value 45 of the curve 43. The so-called half power points are at points 48 and 50 related to the peripheral region 16b of the beam 16. The inner portion of the beam 16a is the beam portion that achieves the desired PPA effect. The peripheral region 16b will not provide the desired PPA effect. Accordingly, as the beam 16 is scanned across the surface, it is essential that the portion 16a of each pulse of the beam be overlapped with subsequent beam positions to assure the PPA effect.

Figure 4:
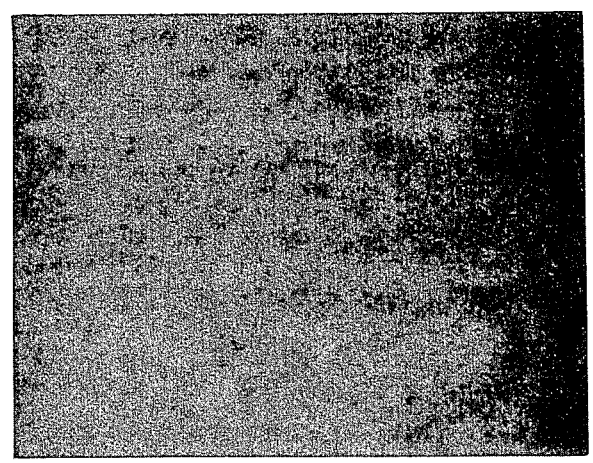
FIG. 4 is a micrograph of a surface portion of a wafer that has been annealed according to this invention whereby no puddle topography is formed.

In one example, a wafer 20 after ion implantation was placed in position on holder 22 and then scanned by the laser beam 16. Wafer 20 was restored to its original crystalline state without any puddles appearing on the wafer surface. This was confirmed by a Nomarsky micrograph as illustrated in FIG. 4. The micrograph of FIG. 4 was made of a bulk silicon wafer 20 that was initially implanted with arsenic ions ($^{75}As^+$), at 180 kiloelectron volts (KeV), with a dose of $1 \times 10^{15}/cm^2$, thereby damaging the original crystalline quality of the wafer material. Subsequently the wafer 20 was completely annealed with the pulse laser 10 operated in the frequency-doubled mode with an output of 0.53 $\mu$m, a pulse width of 15 nanoseconds and a repetition rate of 10 pulses/second. The micrograph of FIG. 4 is virtually black indicating no reflections since there are no discernable features of topography. Note the sharp contrast with a silicon wafer that had extreme puddle topology, as shown in the micrographs of FIGS. 2 and 3 now to be described further.

To understand the problem solved by the present invention reference is made to the micrograph of FIG. 2 illustrating one example of puddle topography developed on a wafer. The micrograph was made with a microscope with 500x magnification. The laser used was a frequency-doubled Nd:YAG laser providing a beam at a wavelength of 0.53 $\mu$m, a diameter of about 40 $\mu$m and a pulse width of 150 nanoseconds. The pulse energy was $2J/cm^2$. The puddle topography is seen by the rings 60 which occur in some peripheral portion of each beam pulse depending on the beam intensity profile (similar to FIG. 5 described above). The puddle topography is caused primarily because the pulse width was too long and beam diameter was too small.

The micrograph shown in FIG. 3 was made with a 15x microscope. The laser used was the Molectron Model MY34 described above but operated with a set of conditions different from that required by this invention as follows: The beam had a diameter of about 3 mm, a wavelength of 1.06 $\mu$m, a pulse width of 15 ns and a per pulse energy of $1J/cm^2$.

The implanted dopant ($^{75}AS^{30}$ at 180 KeV $10^{15}/cm^{-2}$) in the silicon wafer was incompletely activated as indicated by resistivity measurements. The irregular rings 62 distributed over the wafer surface indicate the puddle topography that developed after annealing the ion-implanted wafer with the laser operating at the conditions just stated. The wavelength at 1.06 $\mu$m was too long thus causing the puddles. The scanning rate however was the same as that used to develop the puddle-free annealed wafer of FIG. 4.

The puddle topography of FIGS. 2 and 3 should again be contrasted with the puddle-free micrograph of FIG. 4, described above, made according to the present invention.

See also the article by J. D. Bean, et al., mentioned hereinabove, for another example of puddle topology, as illustrated by FIG. 2 thereof.

The uniformity in annealing by the laser annealing system and method of the invention was evaluated by a two point probe, spreading resistivity measurement across two orthogonal diameters of a three inch (7.67 cm) wafer that had been first ion-implanted and subsequently scan laser annealed according to the invention. The results of such an evaluation indicated that reasonably good uniformity had been achieved.

While the material used in the embodiment described was silicon, it appears that germanium could be annealed by the process. If germanium is used, the wavelength of the laser would preferably be $\lesssim 1$ $\mu$m.

Moreover, while the embodiment of the invention described hereinabove provides for treating silicon material damaged by ion implantation, the invention can be used to anneal amorphous silicon or polycrystalline silicon material. For such applications the non-crystalline material is converted into a single crystalline layer of material. The annealing process is otherwise the same described hereinabove. Moreover metals such as copper, aluminum and the like and other elements such as boron, carbon and the like, could be annealed according to the principles of this invention to convert covalent bonded atoms or molecules into single crystal or essentially single crystalline form.

What is claimed is:

1. A method of annealing a semiconductor material having covalent bonds comprising the steps of:
   irradiating the surface of a body of said material with a beam of electromagnetic radiation having a wavelength that is sufficiently small to absorb the photon energy of the beam substantially only to the desired depth of the surface to be annealed and sufficient power only to break the covalent bonds without undue melting of the material;
   pulsing the beam to provide a duration of each pulse that is 50 nanoseconds or less so as to reduce towards a minimum the diffusion depth of electrons and holes in said material caused by the absorbed energy; and
   providing the diameter of the beam to be significantly greater than the desired annealing depth to reduce convective flow of the material;
   whereby said material is crystallized into a single crystal by annealing without raising the temperature of said material to its melting temperature.

2. The method of claim 1, further comprising the step of:
   scanning said beam relative to said material surface to provide no less than 50% overlap of an irradiated surface between each pulse of the beam.

3. The method of claim 1 or 2, wherein said material is silicon and said beam is a pulsed laser beam having a wavelength of less than 0.6 $\mu$m, a pulse width of less than 50 nanoseconds, a beam diameter of 5 m and power density on the order of one joule per square centimeter, whereby silicon to a depth on the order of one micrometer is annealed.

4. The method according to claim 3, wherein the laser beam has a wavelength of 0.53 $\mu$m.

5. The method according to claim 1 or 2, wherein the diameter of the laser beam is equal to or greater than 5 mm.

6. The method according to claim 1 or 2, wherein the irradiating step comprises irradiating said material to a depth determined by the absorption of the photon energy in the material according to the relation $\lambda \lesssim 1.237/2E_g$ where $\lambda$ is the beam wavelength and $E_g$ is the band gap of the material in electron volts.

7. The method according to claim 1 or 2, wherein said material is a wafer having a diameter on the order of 3 to 5 inches (7.75 to 12.5 centimeters) and said scanning step comprises scanning to anneal said wafer in two to three minutes.

* * * * *

UNITED STATES PATENT AND TRADEMARK OFFICE
CERTIFICATE OF CORRECTION

PATENT NO. : 4,439,245
DATED : March 27, 1984
INVENTOR(S) : Chung Pao Wu

It is certified that error appears in the above-identified patent and that said Letters Patent is hereby corrected as shown below:

Column 7, line 39, "$(^{75}AS^{30}$" should read --$(^{75}AS^{+}$--.

Column 8, line 45, "5m" should read --5mm--.

Signed and Sealed this

Twenty-fourth Day of July 1984

[SEAL]

Attest:

GERALD J. MOSSINGHOFF

Attesting Officer            Commissioner of Patents and Trademarks